(12) United States Patent
Tokunaga et al.

(10) Patent No.: US 7,199,676 B2
(45) Date of Patent: Apr. 3, 2007

(54) FREQUENCY ADJUSTMENT CIRCUIT

(75) Inventors: Tetsuya Tokunaga, Gunma-ken (JP); Hiroyuki Arai, Gunma-ken (JP); Takeshi Kimura, Tochigi-ken (JP); Ryouichi Ando, Saitama-ken (JP); Mamoru Yamaguchi, Gunma-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 96 days.

(21) Appl. No.: 11/196,512

(22) Filed: Aug. 4, 2005

(65) Prior Publication Data

US 2006/0033583 A1    Feb. 16, 2006

(30) Foreign Application Priority Data

Aug. 4, 2004    (JP)    ............................. 2004-228006

(51) Int. Cl.
   *H03K 3/02*    (2006.01)
(52) U.S. Cl. ...................... 331/143; 331/111; 331/135; 331/137; 331/150; 331/177 R; 327/525
(58) Field of Classification Search ................ 331/137, 331/143, 135, 111, 150, 177 R; 327/525
   See application file for complete search history.

(56) References Cited

U.S. PATENT DOCUMENTS 4,814,640 A * 3/1989 Miyake ...................... 327/564
5,450,030 A * 9/1995 Shin et al. .................. 327/525

FOREIGN PATENT DOCUMENTS

JP    2000-148064    5/2000

* cited by examiner

*Primary Examiner*—Robert Pascal
*Assistant Examiner*—Levi Gannon
(74) *Attorney, Agent, or Firm*—Morrison & Foerster LLP

(57) ABSTRACT

A frequency adjustment circuit that maintains a target frequency even when frequency adjustment data of zapping circuit is changed by an external noise is offered. The frequency adjustment circuit includes a reset signal generation circuit, a frequency adjustment data latch circuit that latches and retains the frequency adjustment data ZP1 and ZP2 generated by a first zapping circuit and a second zapping circuit based on a latch clock ZCLK and a latch clock generation circuit that generates the latch clock ZCLK. The reset signal generation circuit generates a periodic reset signal ZRES that is synchronized with a rise of an enable signal EN generated from an interface circuit. The latch clock generation circuit generates the latch clock ZCLK that is synchronized with a fall of the enable signal EN.

16 Claims, 12 Drawing Sheets

FIG.2A
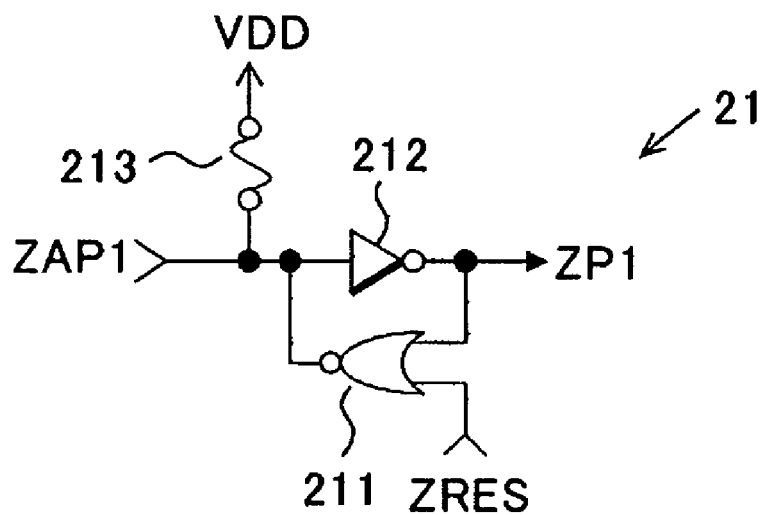
FIG.2B
|  | ZRES | ZAP1 | ZP1 |
|---|---|---|---|
| connected | 0 | H Level | 0 |
|  | 1 | L Level | 1 |
| disconnected | 0 | L Level | 1 |
|  | 1 | L Level | 1 |
FIG.2C
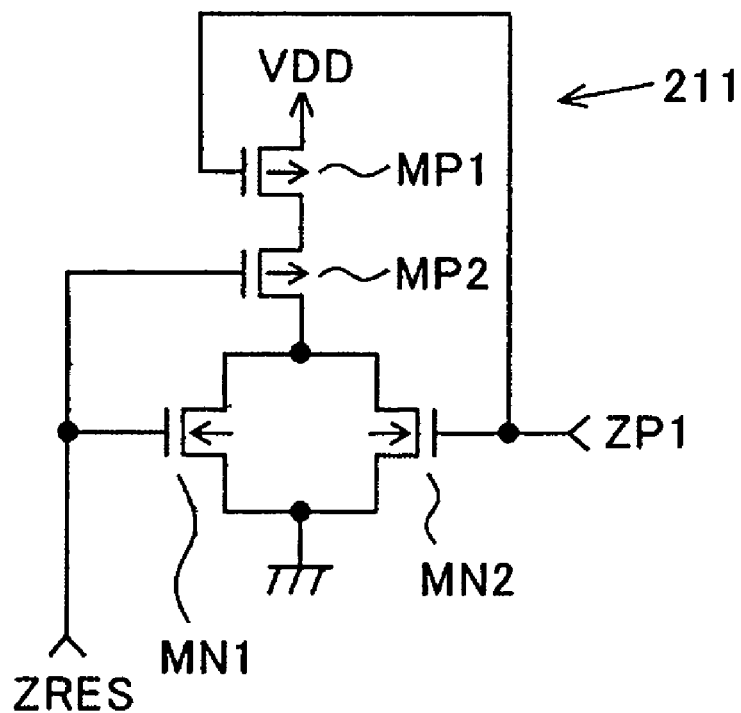

FREQUENCY ADJUSTMENT CIRCUIT

CROSS-REFERENCE OF THE INVENTION

This invention is based on Japanese Patent Application No. 2004-228006, the content of which is incorporated herein by reference in its entirety.

BACKGROUND OF THE INVENTION

1. Field of the Invention

This invention relates to a frequency adjustment circuit, specifically to a frequency adjustment circuit to adjust a frequency of an oscillation circuit that oscillates according to a time constant set by a time constant circuit.

2. Description of the Related Art

System clocks of an LSI (Large Scale Integration) are generated based on clocks generated from an RC oscillation circuit that uses a resistor R and a capacitor C, and is incorporated in the LSI. When the resistor R and the capacitor C are incorporated in the LSI, however, the oscillation frequency varies by the oscillator circuit because variations are caused in characteristics of the passive devices due to variations in a manufacturing process of the LSI. Therefore, the oscillation frequency has been adjusted to a target value using frequency adjustment data produced using a zapping device such as a polysilicon fuse.

FIG. 16 is a circuit diagram showing a frequency adjustment circuit according to a prior art. An RC oscillation circuit 10 is provided with an oscillation loop composed of a hysteresis inverter 11, an inverter 12 and a P-channel type MOS transistor 13, a waveform shaping circuit 14 that shapes an oscillation wave from the oscillation loop and outputs clocks OSCCLK and a time constant circuit 15 connected to the oscillation loop and composed of resistors Rosc1, Rosc2, Rosc3 and Rosc4 and a capacitor Cosc.

Each of a first zapping circuit 21 and a second zapping circuit 22 generates each of frequency adjustment data ZP1 and ZP2 that correspond to connection/disconnection of zapping devices, respectively, according to a reset signal RESET. Connection/disconnection of each of the zapping devices is permanently set according to voltages applied to zapping terminals ZAP1 and ZAP2.

The frequency adjustment data ZP1 and ZP2 generated from the first zapping circuit 21 and the second zapping circuit 22 is decoded with a frequency adjustment data decoder 23. Each of decoded data ZDC10, ZDC00 and ZDC01 is applied to each of ON/OFF control terminals of switches SW1, SW2 and SW3 made of CMOS analog switches, respectively.

For example, when the frequency adjustment data (ZP1, ZP2) from the first zapping circuit 21 and the second zapping circuit 22 is (1, 0), the decoded data (ZDC10, ZDC00, ZDC01) from the frequency adjustment data decoder 23 is (1, 0, 0). Since the switch SW1 is turned on while the switches SW2 and SW3 are turned off as a result, one end of the resistor Rosc1 is grounded. This makes the time constant circuit 15 being composed of the resistor Rosc1 and the capacitor Cosc. In this case, the RC oscillation circuit 10 oscillates at a frequency fosc that corresponds to the time constant determined by the resistor Rosc1 and the capacitor Cosc. That is, when the P-channel type MOS transistor 13 is turned on, the capacitor Cosc is charged and an electric potential at an input terminal of the hysteresis inverter 11 is raised. When an output of the hysteresis inverter 11 is reversed, the P-channel type MOS transistor 13 is turned off through the inverter 12.

As a result, electric charges stored in the capacitor Cosc are discharged to the ground through the resistor Rosc1. Then the electric potential at the input terminal of the hysteresis inverter 11 is lowered. When the output of the hysteresis inverter 11 is inverted once again, the P-channel type MOS transistor 13 is turned on through the inverter 12. The RC oscillation circuit 10 oscillates by alternating the charging and the discharging. Therefore, according to the frequency adjustment circuit, the oscillation frequency of the RC oscillation circuit 10 can be adjusted by generating desired frequency adjustment data ZP1 and ZP2 according to the connection/disconnection of the zapping devices.

Further information on the technologies described above is disclosed in Japanese Patent Application Publication No. 2000-148064, for example.

However, when an external noise is applied to a certain terminal and enters into an inside of the LSI incorporating the RC oscillation circuit 10 described above while the LSI is in operation, the frequency adjustment data retained in the first zapping circuit 21 and the second zapping circuit 22 is changed in some cases. For example, when the frequency adjustment data ZP1 of the first zapping circuit 21 is changed from "1" to "0", the frequency adjustment data (ZP1, ZP2) is modified to (0, 0). Corresponding to the modification described above, it is assumed that the decoded data (ZDC10, ZDC00, ZDC01) from the frequency adjustment decoder 23 is modified from (1, 0, 0) to (0, 1, 0).

Then the resistor and the capacitor constituting the oscillation loop are modified from the resistor Rosc1 and the capacitor Cosc to the resistors Rosc1 and Rosc2 and the capacitor Cosc. The modification results in an oscillation frequency lower than the target frequency fosc. In order to recover the frequency adjustment data (ZP1, ZP2) changed by the external noise to the normal data (1, 0), inputting the reset signal RESET once again is required. However, recovering the frequency adjustment data (ZP1, ZP2) to the normal data has been practically impossible, because the reset signal has been usually designed to be inputted only at power-on of the LSI.

SUMMARY OF THE INVENTION

This invention offers an oscillation frequency adjustment circuit that adjusts an oscillation frequency of an oscillation circuit oscillating according to a time constant set by a time constant circuit. The oscillation frequency adjustment circuit includes a zapping circuit that generates frequency adjustment data according to status of zapping devices based on a reset signal that is periodically inputted, a data latch circuit that latches and retains the frequency adjustment data generated by the zapping circuit based on a latch clock generated with a delay behind the reset signal and a time constant adjustment circuit that adjusts the time constant of the time constant circuit according to the frequency adjustment data retained in the frequency adjustment data latch circuit.

A periodic reset signal and a latch clock used in the frequency adjustment circuit are generated using a chip enable signal and address data that assigns addresses of devices transferred from a microcomputer.

In addition, a serial data counter that counts a number of bits of data transferred from the microcomputer is provided. The latch clock to the frequency adjustment data latch is controlled based on an output of the serial data counter so that the frequency adjustment data from the zapping circuit is latched and retained only when the data transferred from the microcomputer has a predetermined number of bits.

BRIEF DESCRIPTION OF THE DRAWINGS

FIGS. 2A, 2B and 2C are circuit diagrams and a table to explain a first zapping circuit 21.

DETAILED DESCRIPTION OF THE INVENTION

Figure 1:
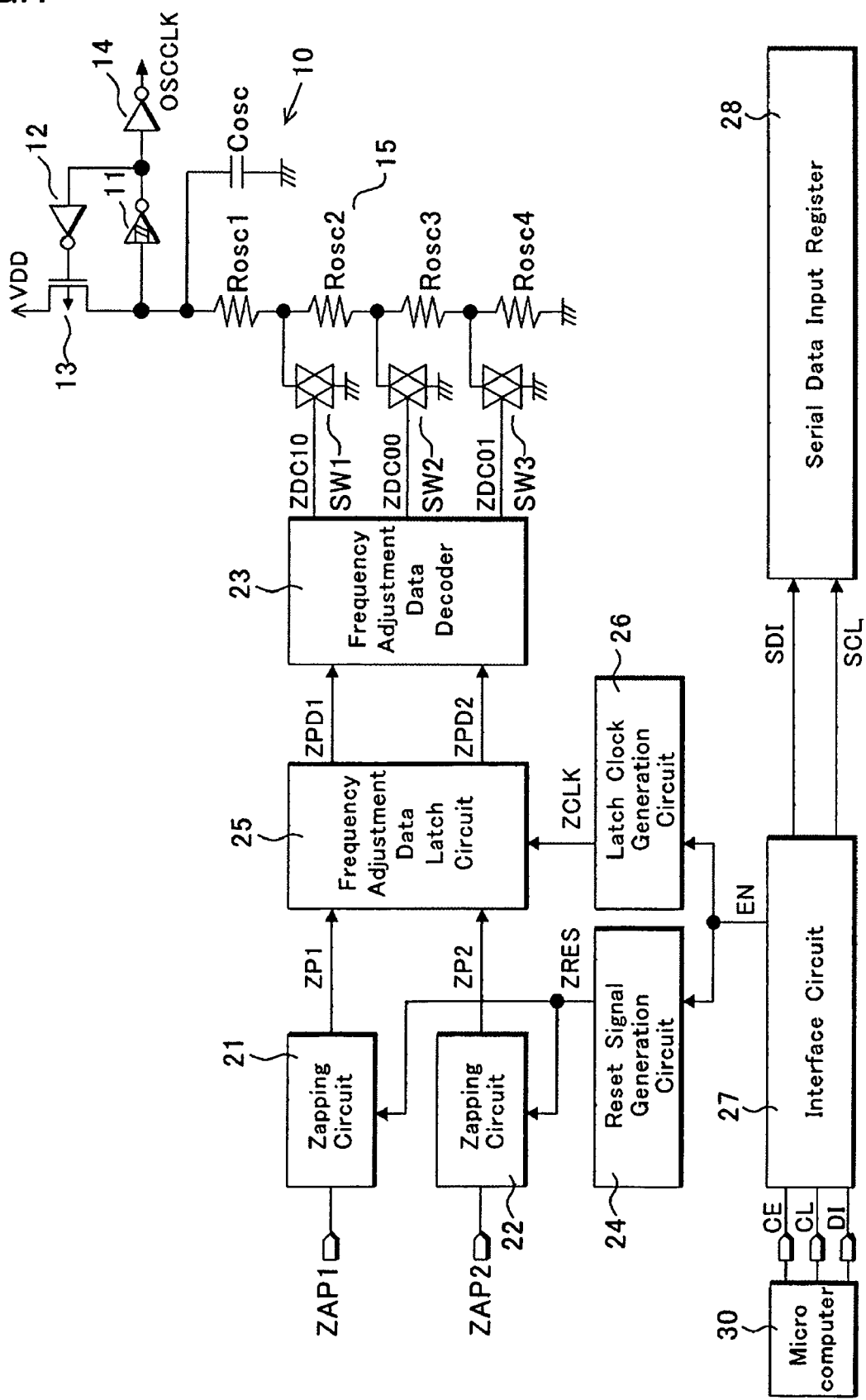
FIG. 1 is a circuit diagram of a frequency adjustment circuit according to a first embodiment of this invention.
Figure 16:
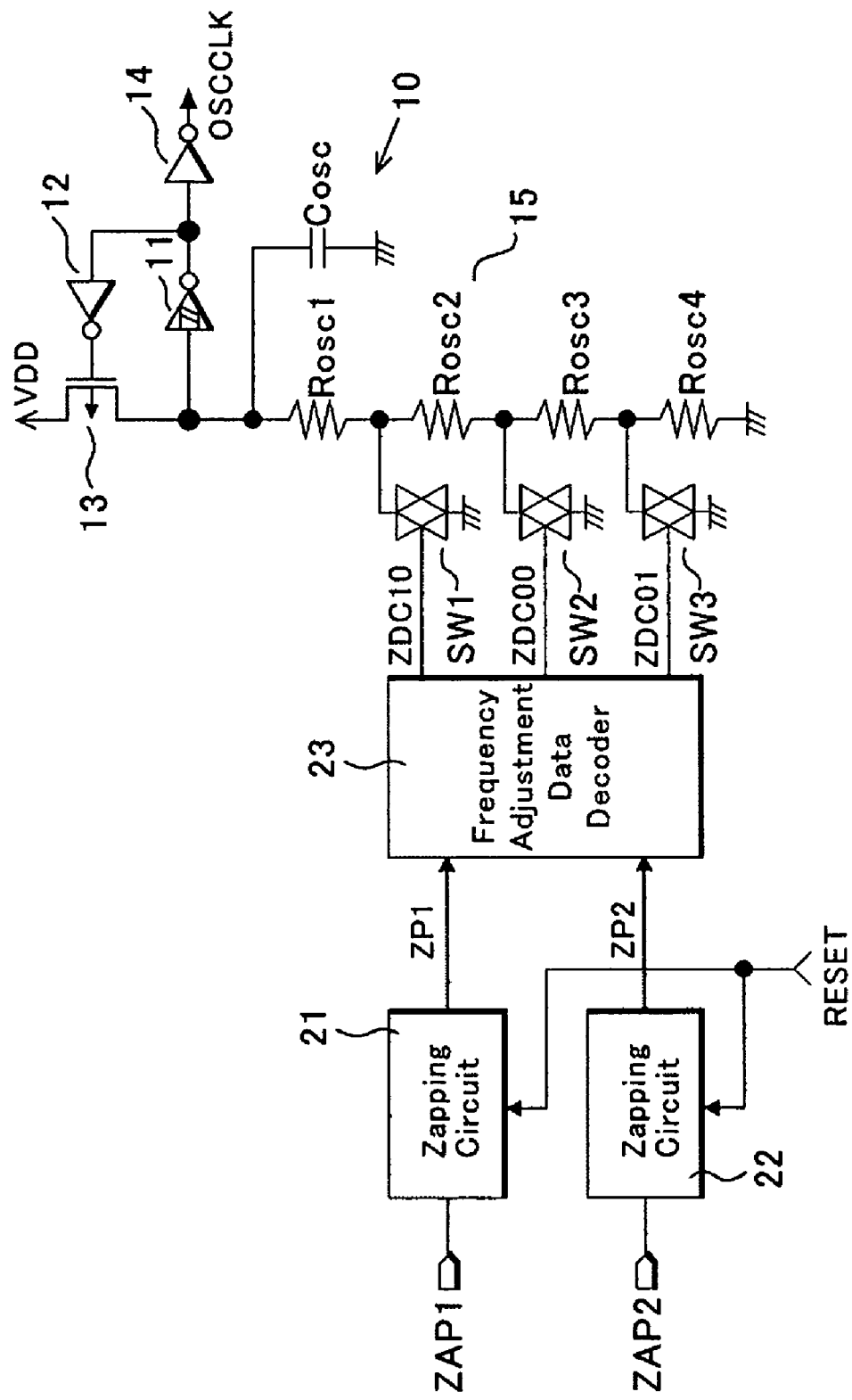
FIG. 16 is a circuit diagram showing a frequency adjustment circuit according to a prior art.

Next, a frequency adjustment circuit according to a first embodiment of this invention will be explained hereinafter referring to the drawings. In addition to a circuit shown in FIG. 16, the frequency adjustment circuit includes a reset signal generation circuit 24 that generates a periodic reset signal ZRES, a frequency adjustment data latch circuit 25 that latches and retains frequency adjustment data ZP1 and ZP2 generated by a first zapping circuit 21 and a second zapping circuit 22 based on latch clocks ZCLK, and a latch clock generation circuit 26 that generates the latch clocks ZCLK, as shown in FIG. 1 that is a whole structure circuit diagram.

The reset signal generation circuit 24 generates a periodic reset signal ZRES that is synchronized with a rise (signal generation) to an H (high) level of an enable signal EN generated from an interface circuit 27 interfacing with an external microcomputer 30 disposed outside an LSI that incorporates the frequency adjustment circuit. The latch clock generation circuit 26 generates latch clocks ZCLK that is synchronized with a fall (signal termination) to an L (low) level of the enable signal EN.

The frequency adjustment data ZP1 and ZP2 generated in the first and second zapping circuits 21 and 22 are periodically refreshed to normal values. The refreshed frequency adjustment data ZP1 and ZP2 is latched according to the latch clock ZCLK that is generated with a delay behind the reset signal ZRES and retained in the frequency adjustment data latch circuit 25. Output data ZPD1 and ZPD2 of the frequency adjustment data latch circuit 25 is decoded by a frequency adjustment data decoder 23. Each of decoded data ZDC10, ZDC00 and ZDC01 is applied to an ON/OFF control terminal of each of switches SW1, SW2 and SW3, respectively.

Next, a structure of each circuit described above will be explained referring to the drawings. Explanations on structures of an RC oscillation circuit 10 and a time constant circuit 15 are omitted, since they are similar to those in the conventional art.

FIG. 2A is a circuit diagram of the first zapping circuit 21. FIG. 2B shows a table to explain operation of the zapping circuit 21. FIG. 2C is a transistor-level circuit diagram of a NOR circuit 211 shown in FIG. 2A. The second zapping circuit 22 is structured similar to the first zapping circuit 21.

The first zapping circuit 21 includes the NOR circuit 211, an inverter 212 and a fuse 213 made of polysilicon that makes a zapping device. An output of the NOR circuit 211 is inputted to the inverter 212. An output of the inverter 212 is inputted to a first input terminal of the NOR circuit 211. The reset signal ZRES is inputted to a second input terminal of the NOR circuit 211. One end of the fuse 213 is connected to a first zapping terminal ZAP1, while a power supply potential VDD is applied to another end of the fuse 213.

Operation of the first zapping circuit 21 is explained. Suppose the reset signal ZRES is inputted when the fuse 213 is connected (not open). The reset signal ZRES is a pulse having a predetermined pulse width. When the reset signal ZRES becomes "1" (H level), the NOR circuit 211 outputs "0" (L level). In this embodiment, the size of an N-channel type MOS transistor MN1 in the NOR circuit 211 is large enough to have low ON impedance compared with impedance of the fuse 213. Then an electric potential at the zapping terminal ZAP1 falls to the L level temporarily, and the frequency adjustment data ZP1, that is an output of the inverter 212, becomes "1" temporarily. An N-channel type MOS transistor MN2 in the NOR circuit 211 is also turned on as a result.

When the reset signal ZRES later turns to "0" (L level), the N-channel type MOS transistor MN1 in the NOR circuit 211 is turned off. Because the size of the N-channel type MOS transistor MN2 in the NOR circuit 211 provides a high enough ON impedance compared with the impedance of the fuse 213, the electric potential at the zapping terminal ZAP1 turns to the H level and the frequency adjustment data ZP1, that is the output of the inverter 212, is settled to "0".

Now, on the other hand, a predetermined high voltage is applied to the zapping terminal ZAP1 to let an excess current flow through the fuse 213 so that the fuse 213 is cut off. Suppose that the reset signal ZRES is inputted when the fuse 213 is thus disconnected. When the reset signal ZRES becomes "1" (H level), the NOR circuit 211 outputs "0" (L level). Then the electric potential at the zapping terminal ZAP1 falls to the L level, and the frequency adjustment data ZP1, that is the output of the inverter 212, becomes "1" temporarily.

When the reset signal ZRES later turns to "0" (L level), the NOR circuit 211 becomes an inverter in effect, and the frequency adjustment data ZP1 (data "1"), that is the output of the inverter 212, is maintained by a retention circuit composed of the inverter 212 and the NOR circuit 211. As described above, the frequency adjustment data ZP1 and ZP2 can be generated by changing the circuit structure through the use of the zapping devices.

Figure 3:
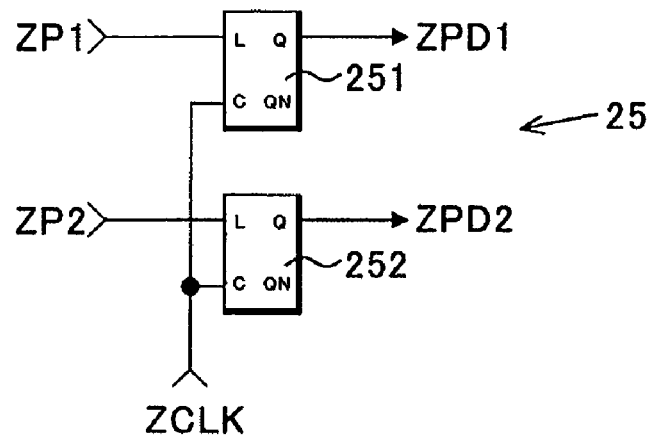
FIG. 3 is a circuit diagram of a frequency adjustment data latch circuit 25.

FIG. 3 is a circuit diagram of the frequency adjustment data latch circuit 25. The circuit includes a first latch circuit 251 and a second latch circuit 252, each of which latches and stores each of the frequency adjustment data ZP1 and ZP2, respectively, in synchronization with the latch clock ZCLK.

Figure 4:
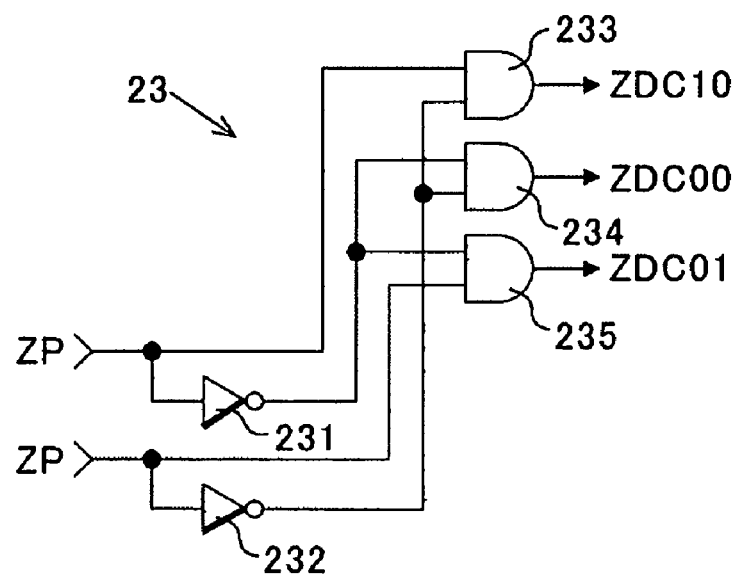
FIG. 4 is a circuit diagram of a frequency adjustment data decoder 23.
Figure 5:
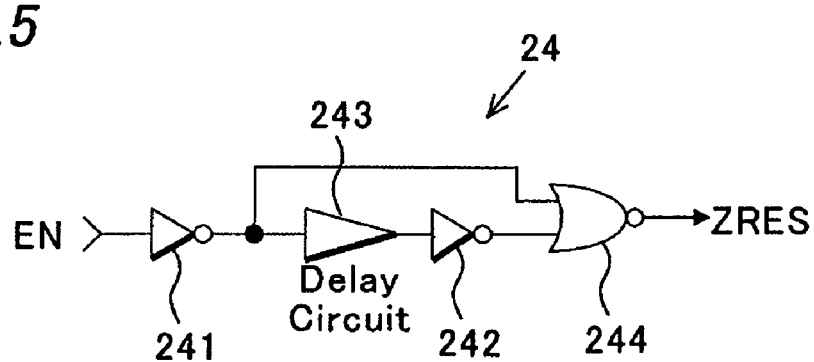
FIG. 5 is a circuit diagram of a reset signal generation circuit 24.

FIG. 4 is a circuit diagram of the frequency adjustment data decoder 23. The circuit includes two inverters 231 and 232 and three AND circuits 233, 234 and 235. FIG. 5 is a circuit diagram of the reset signal generation circuit 24. The circuit detects the rise of the enable signal EN and generates the reset signal ZRES (a pulse signal) that is synchronized with the rise of the enable signal EN, and includes inverters 241 and 242, a delay circuit 243 and a NOR circuit 244.

Figure 6:
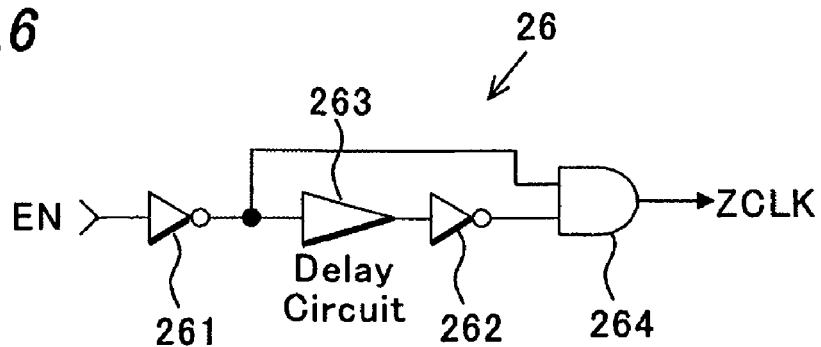
FIG. 6 is a circuit diagram of a latch clock generation circuit 26.
Figure 7:
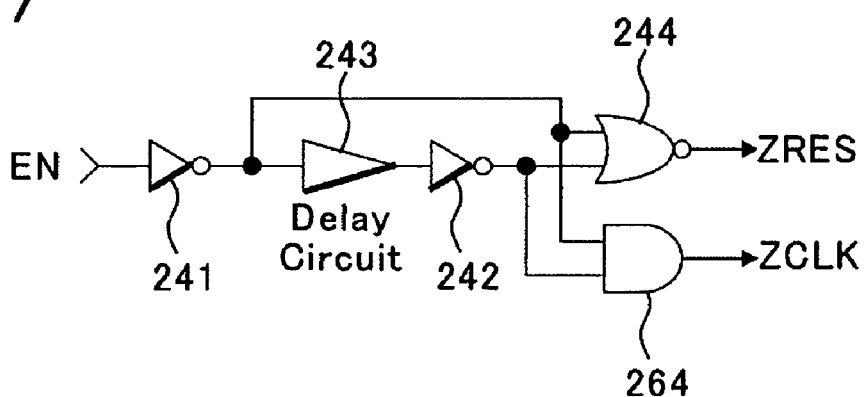
FIG. 7 is a circuit diagram showing a circuit in which the reset signal generation circuit 24 shown in FIG. 5 and the latch clock generation circuit 26 shown in FIG. 6 share common portions.

FIG. 6 is a circuit diagram of the latch clock generation circuit 26. The circuit detects the fall of the enable signal EN and generates the latch clock ZCLK (a pulse signal) that is synchronized with the fall of the enable signal EN, and includes inverters 261 and 262, a delay circuit 263 and an AND circuit 264. FIG. 7 is a circuit diagram showing a combined circuit in which the reset signal generation circuit 24 shown in FIG. 5 and the latch clock generation circuit 26 shown in FIG. 6 share common components. The reset signal ZRES and the latch clock ZCLK can be generated with fewer devices.

Figure 8:
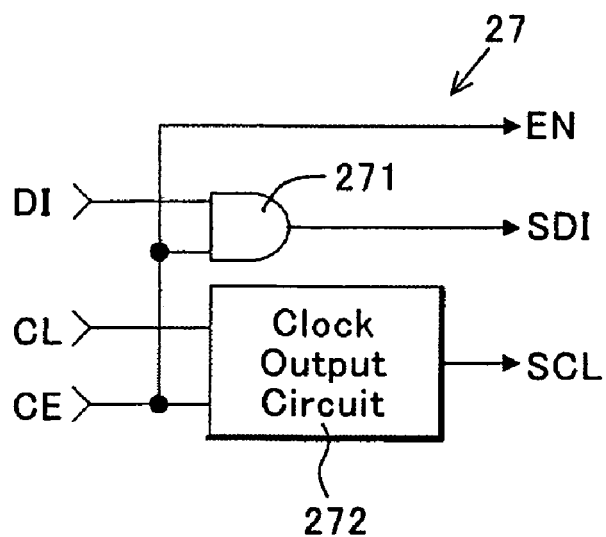
FIG. 8 shows a circuit diagram of an interface circuit 27.

FIG. 8 is a circuit diagram of the interface circuit 27 that interfaces with the external microcomputer 30 disposed outside the LSI. The interface circuit 27 includes a data input terminal DI that receives data serially transferred from the microcomputer 30, a clock input terminal CL that receives data transfer clocks and a chip enable terminal CE that receives a chip enable signal to set the LSI in a selected status. Serial data SDI (display data when the LSI is a display driver, for example), that is from the microcomputer 30 and has passed through an AND circuit 271 when the chip enable signal is at the H level, is transferred to and temporarily stored in a serial data input register 28 in synchronization with serial transfer clocks SCL that have passed through a clock output circuit 272.

The chip enable signal inputted to the chip enable terminal CE is used as the enable signal EN in the reset signal generation circuit 24 and the latch clock generation circuit 26 without modification. In this embodiment, the serial data transfer from the microcomputer 30 is performed periodically and the chip enable signal is generated periodically. Therefore the enable signal EN is also generated periodically.

Figure 9:
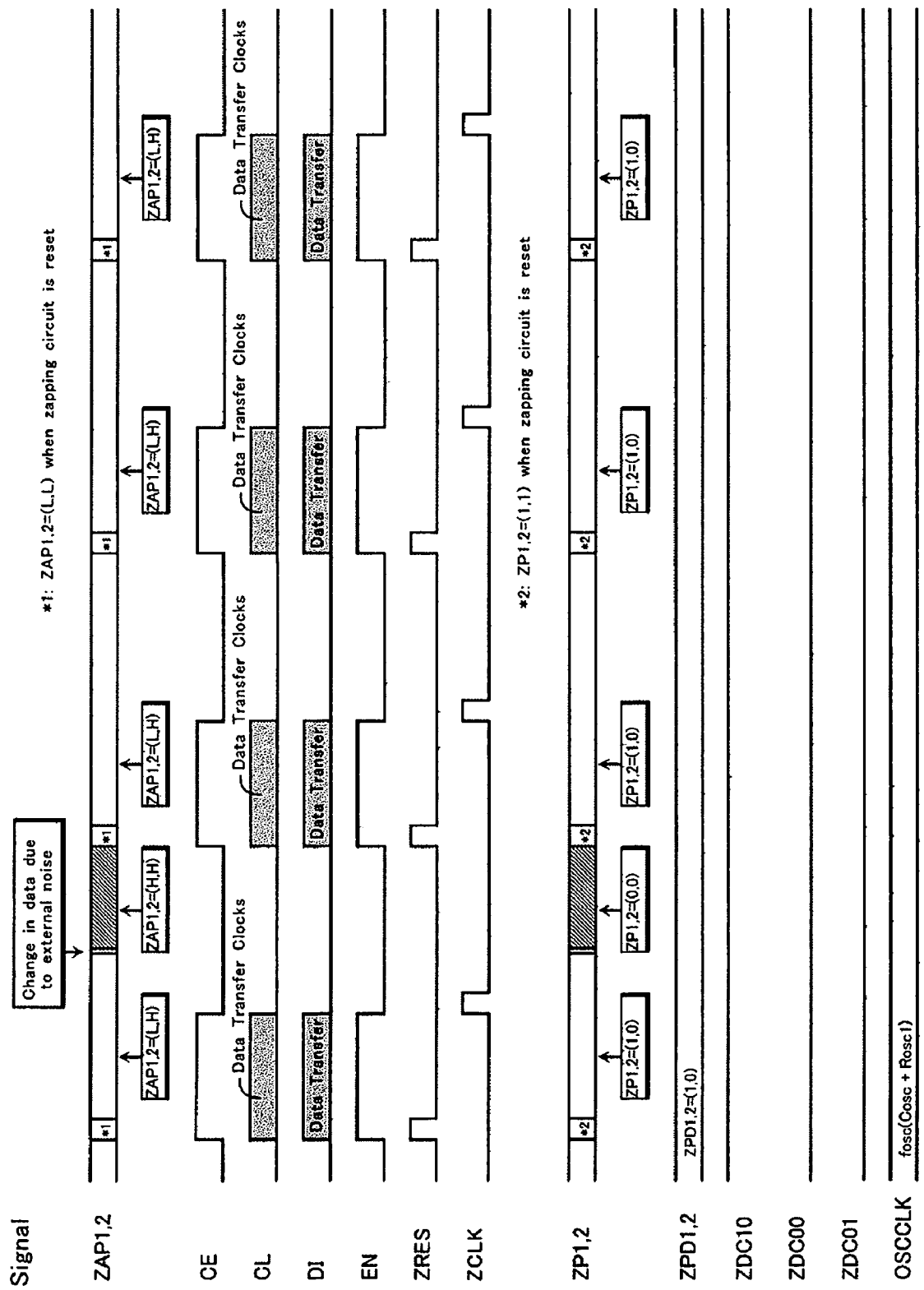
FIG. 9 is a timing chart showing operation of the frequency adjustment circuit according to the first embodiment of this invention.

An operation of the frequency adjustment circuit described above will be explained hereinafter referring to a timing chart shown in FIG. 9. First, it is assumed that a result of oscillation frequency test on an oscillation circuit 10 by an LSI tester requires that the frequency adjustment data (ZP1, ZP2) is set to be (1, 0) in order to obtain the target oscillation frequency fosc. In this case, the predetermined high voltage is applied to the zapping terminal ZAP1 in the first zapping circuit 21 to let the excess current flow through the fuse 213 so that the fuse 213 is cut off. On the other hand, a fuse 213 in the second zapping circuit 22 is kept connected.

When the enable signal EN from the interface circuit 27 rises, the reset signal ZRES is generated by the reset signal generation circuit 24 in response to the rise of the enable signal EN. The first and the second zapping circuits 21 and 22 are reset by the reset signal ZRES, and the frequency adjustment data (ZP1, ZP2) after the reset is set to (1, 0).

When the enable signal EN falls later, the latch clock ZCLK is generated by the latch clock generation circuit 26. The frequency adjustment data (ZP1, ZP2)=(1, 0) is latched and stored in the frequency adjustment data latch circuit 25 in synchronization with the latch clock ZCLK.

The frequency adjustment data decoder 23 decodes the data based on the frequency adjustment data (ZP1, ZP2)=(1, 0) stored in the frequency adjustment data latch circuit 25, and outputs the decoded data (ZDC10, ZDC00, ZDC01)=(1, 0, 0) to the switches SW1, SW2 and SW3. As a result, one end of the resistor Rosc1 is grounded, since the switch SW1 is turned on while the switches SW2 and SW3 are turned off. This makes the time constant circuit 15 being composed of the resistor Rosc1 and the capacitor Cosc. Thus the RC oscillation circuit 10 outputs the oscillation clocks OSCCLK of the oscillation frequency fosc ($\propto 1/(Cosc \cdot Rosc1)$) that corresponds to the time constant determined by the resistor Rosc1 and the capacitor Cosc.

Since the enable signal EN from the interface circuit 27 is generated periodically as described above, the reset operation by the zapping circuits 21 and 22 and the latch operation by the frequency adjustment data latch circuit 25 are also performed periodically, and the oscillation frequency fosc of the RC oscillation circuit 10 is kept constant.

When an external noise enters into the LSI through a terminal by some reason and the frequency adjustment data ZP1 and ZP2 of the first zapping circuit 21 and the second zapping circuit 22 has been changed, for example when ZP1 of the first zapping circuit 21 has been changed from "1" to "0", although the frequency adjustment data (ZP1, ZP2) is once changed to (0, 0), the data (ZP1, ZP2) can be recovered to (1, 0) by the operation described above when the interface circuit 27 later receives data from the microcomputer 30 and generates the enable signal EN. The oscillation frequency fosc of the RC oscillation circuit 10 is kept constant, because the frequency adjustment data ZP1 and ZP2 retained in the frequency adjustment data latch circuit 25 is kept intact.

Figure 10:
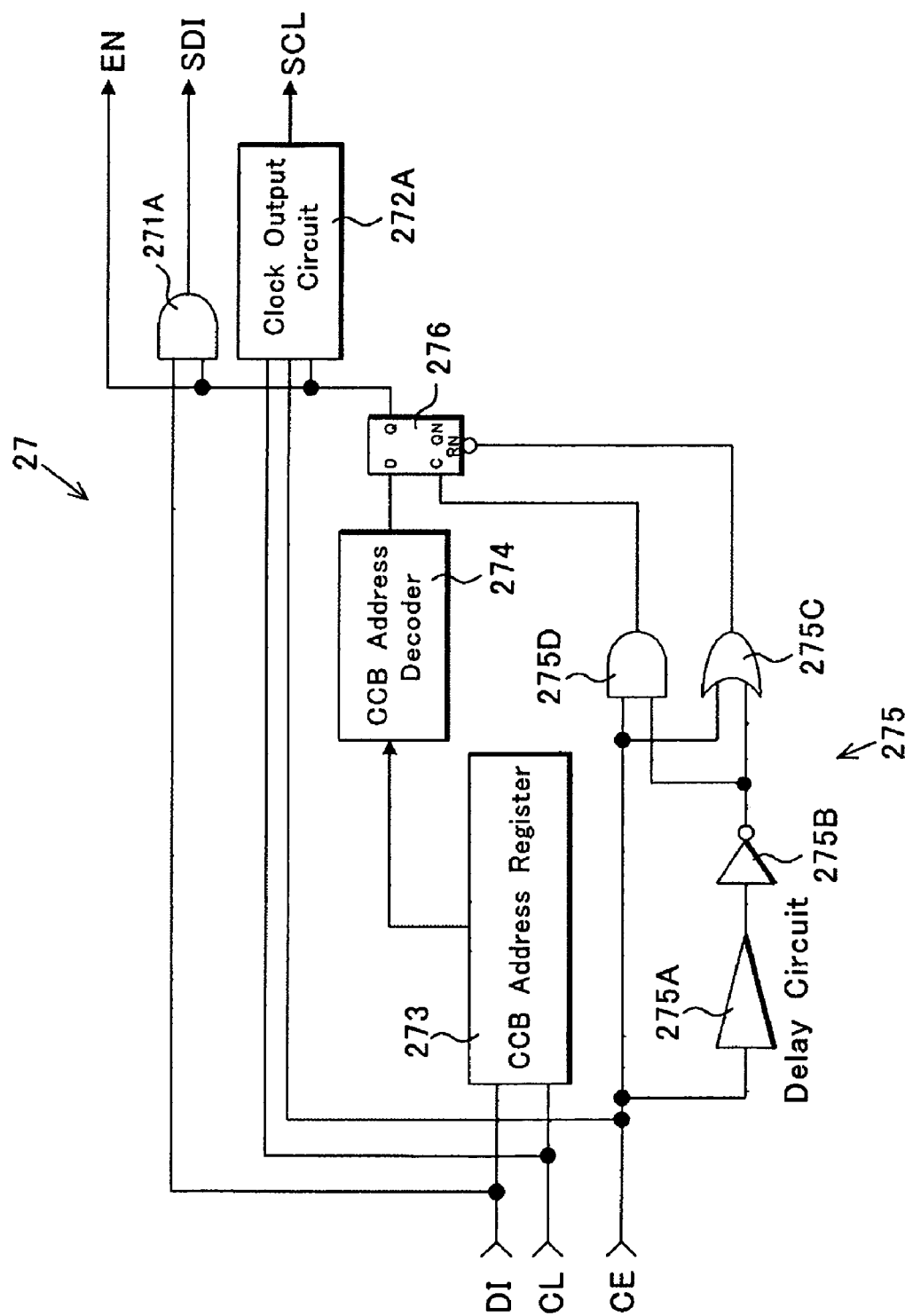
FIG. 10 is a circuit diagram of an interface circuit used in a frequency adjustment circuit according to a second embodiment of this invention.

Next, a frequency adjustment circuit according to a second embodiment of this invention will be explained hereinafter referring to the drawings. The structure of the interface circuit 27 in the second embodiment is different from that in the first embodiment, while the other structure of the circuit is similar to that of the first embodiment. FIG. 10 shows a circuit diagram of the interface circuit 27 in the second embodiment. This interface circuit 27 is provided with function to verify that address data (address data of a device, particularly in this embodiment, address data that specifies the LSI in which the frequency adjustment circuit is incorporated) transferred from the microcomputer 30 together with the data coincides with a predetermined data that is assigned specifically to the LSI.

The interface circuit 27 includes a data input terminal DI that receives the data and the address data serially transferred from the microcomputer 30, a clock input terminal CL that receives transfer clocks for the data and the address data and a chip enable terminal CE that receives a chip enable signal to set the LSI in a selected status. Serial data SDI (display data when the LSI is a display driver, for example), that is from the microcomputer 30 and has passed through an AND circuit 271A when the chip enable signal is at the H level, is transferred to and temporarily stored in a serial data input register 28 in synchronization with serial transfer clocks SCL that have passed through a clock output circuit 272A.

The interface circuit 27 further includes a CCB (Computer Control Bus) address register 273 that takes in the address data serially transferred from the microcomputer 30 in synchronization with address transfer clocks and temporarily stores it, a CCB address decoder 274 that decodes the temporarily stored address data, verifies whether the stored data coincides with the predetermined data specific to the LSI and generates an address verify signal (H level when verified), a chip enable detection circuit 275 that detects a rise and a fall of the chip enable signal and an address verify signal register 276 that takes in and retains the address verify signal in synchronization with the rise of the chip enable signal and is reset in synchronization with the fall of the chip enable signal. An output of the address verify signal register 276 is used as the enable signal EN and is supplied to the reset signal generation circuit 24 and the latch clock generation circuit 26 that are explained in the first embodiment.

Figure 11:
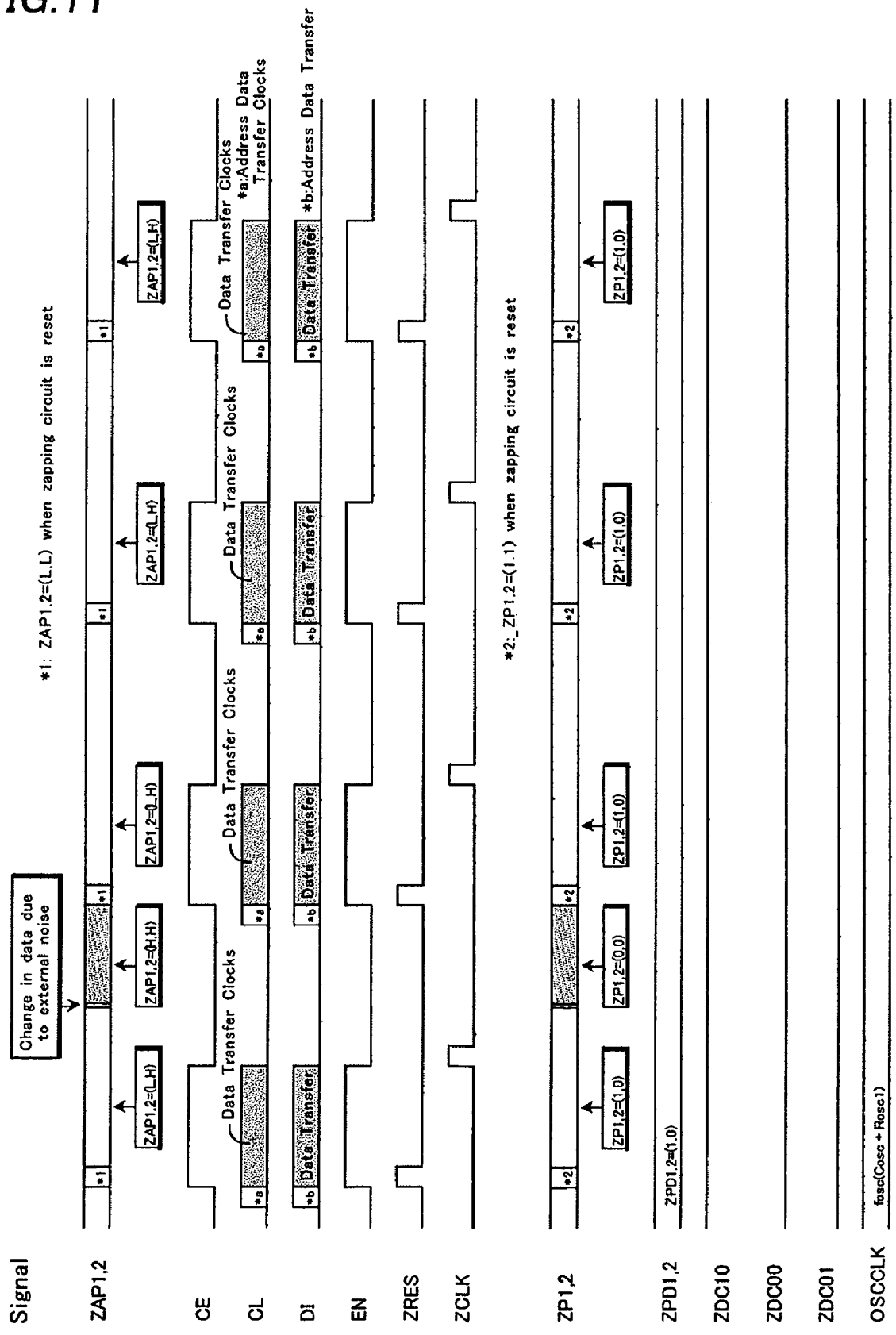
FIG. 11 is a timing chart showing operation of the frequency adjustment circuit according to the second embodiment of this invention.

An operation of the frequency adjustment circuit described above will be explained hereinafter referring to a timing chart shown in FIG. 11. First, it is assumed that a result of oscillation frequency test on an oscillation circuit 10 by an LSI tester requires that the frequency adjustment data (ZP1, ZP2) is set to be (1, 0) in order to obtain the target oscillation frequency fosc as in the first embodiment. In this case, the predetermined high voltage is applied to the zapping terminal ZAP1 in the first zapping circuit 21 to let the excess current flow through the fuse 213 so that the fuse 213 is cut off. On the other hand, a fuse 213 in the second zapping circuit 22 is kept connected.

When the address data is transferred from the microcomputer 30 and the address data is verified with the CCB address decoder 274 in the interface circuit 27, the address verify signal, that is the output of the CCB address decoder 274, becomes the H level. And the address verify signal is taken into the address verify signal register 276 in synchronization with the rise of the chip enable signal. Then the enable signal EN, that is the output of the address verify signal register 276, rises to the H level, and the reset signal ZRES is generated by the reset signal generation circuit 24 in response.

The first and the second zapping circuits 21 and 22 are reset by the reset signal ZRES, and the frequency adjustment data (ZP1, ZP2) after the reset is set to be (1, 0). When the chip enable signal falls later, the address verify signal register 276 is reset, the enable signal EN falls to the L level and the latch clock ZCLK is generated by the latch clock generation circuit 26. The frequency adjustment data (ZP1, ZP2)=(1, 0) is latched and stored in the frequency adjustment data latch circuit 25 in synchronization with the latch clock ZCLK.

The rest of the operation is similar to that in the first embodiment. The frequency adjustment data decoder 23 decodes the data based on the frequency adjustment data (ZP1, ZP2)=(1, 0) stored in the frequency adjustment data latch circuit 25, and outputs the decoded data (ZDC10, ZDC00, ZDC01)=(1, 0, 0) to the switches SW1, SW2 and SW3. As a result, one end of the resistor Rosc1 is grounded, since the switch SW1 is turned on while the switches SW2 and SW3 are turned off. This makes the time constant circuit 15 being composed of the resistor Rosc1 and the capacitor Cosc. Thus the RC oscillation circuit 10 outputs the oscillation clocks OSCCLK of the oscillation frequency fosc ($\propto 1/(Cosc \cdot Rosc1)$) that corresponds to the time constant determined by the resistor Rosc1 and the capacitor Cosc.

When an external noise enters into the LSI through a terminal by some reason and the frequency adjustment data ZP1 and ZP2 of the first zapping circuit 21 and the second zapping circuit 22 has been changed, for example when ZP1 of the first zapping circuit 21 has been changed from "1" to "0", although the frequency adjustment data (ZP1, ZP2) is once changed to (0, 0), the data (ZP1, ZP2) can be recovered to (1, 0) by the operation described above when the interface circuit 27 later receives the address data from the microcomputer 30 and generates the enable signal EN when the address data is verified to match the address data specific to the LSI. The oscillation frequency fosc of the RC oscillation circuit 10 is kept constant, because the frequency adjustment data ZP1 and ZP2 retained in the frequency adjustment data latch circuit is kept intact.

Figure 12:
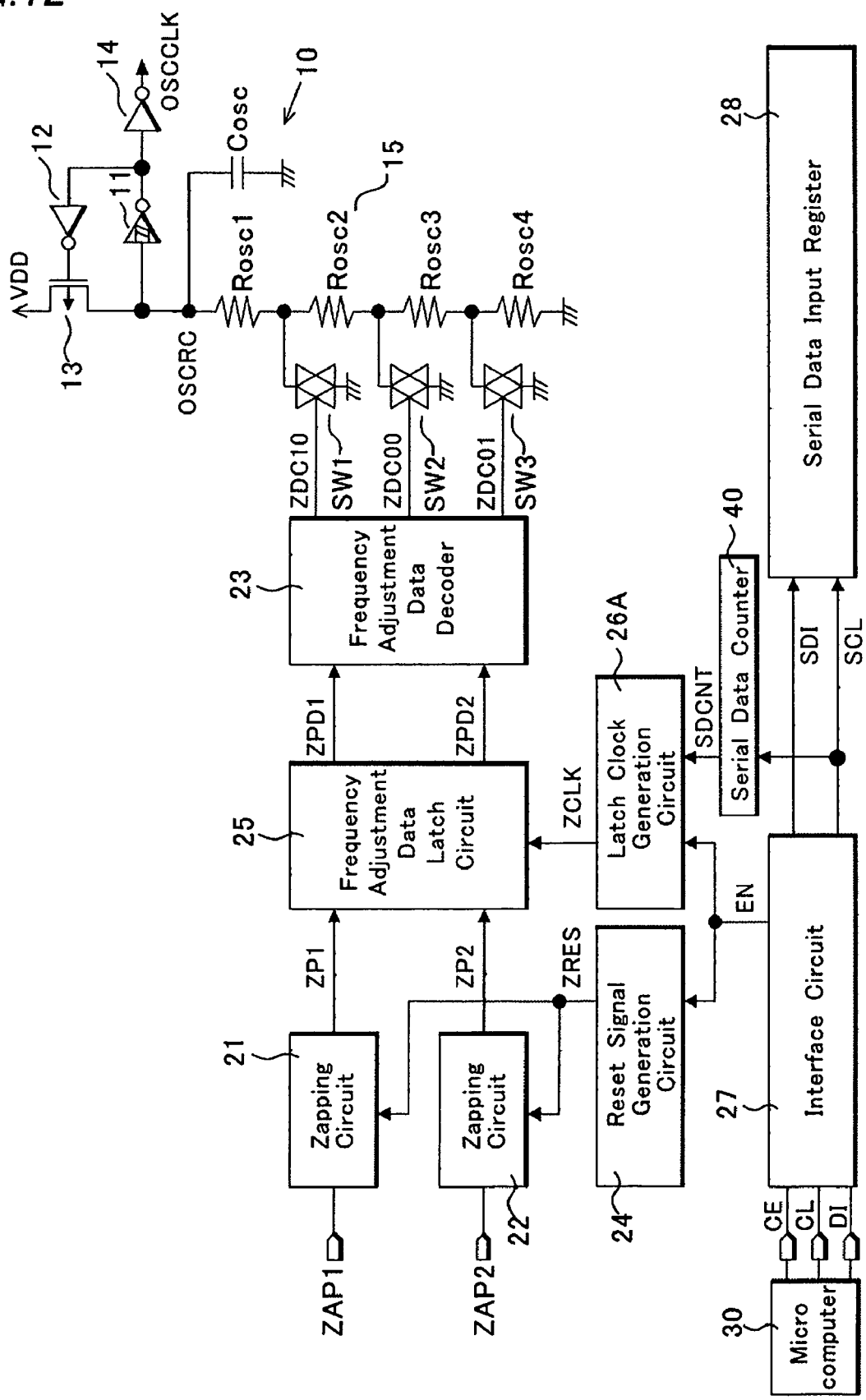
FIG. 12 is a circuit diagram of a frequency adjustment circuit according to a third embodiment of this invention.

Next, a frequency adjustment circuit according to a third embodiment of this invention will be explained hereinafter referring to the figures. This circuit is the circuit in the first embodiment shown in FIG. 1 with the following modifications. As shown in FIG. 12, a serial data counter 40 that counts a number of bits of serial-transfer data by counting the transfer clocks from the microcomputer 30 and generates a count output signal SDCNT only when the count reaches a specific number is provided, and the latch clock generation circuit 26 is modified to a latch clock generation circuit 26A so that the latch clock generation circuit 26A generates the latch clocks ZCLK corresponding to the enable signal EN from the interface circuit 27 and the count output signal SDCNT of the serial data counter 40.

Figure 13A:
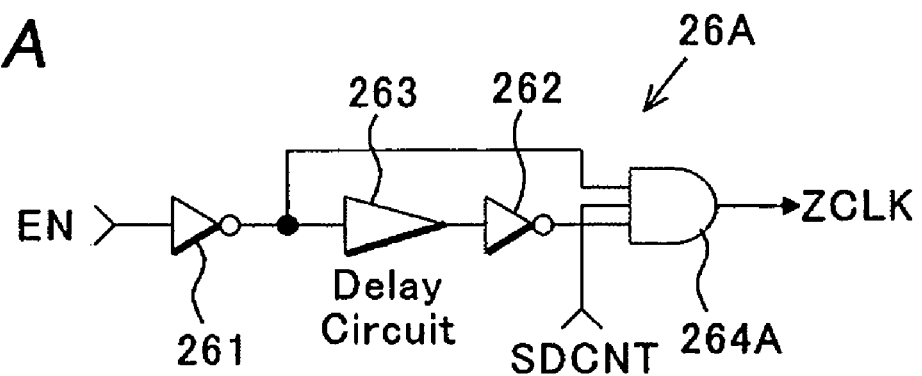
FIGS. 13A and 13B are circuit diagrams of latch clock generation circuits used in the frequency adjustment circuit according to the third embodiment of this invention.

To explain more concretely, the interface circuit 27 is the same as the interface circuit 27 that is shown in FIG. 8 and explained in the first embodiment. The serial data counter 40 counts the number of bits of the serial-transfer data by counting the serial transfer clocks SCL that have passed through the interface circuit 27. The NAND circuit 264 in FIG. 6 is modified into a three input NAND circuit 264A in the latch clock generation circuit 26A, and the count output signal SDCNT is inputted to the NAND circuit 264A, as shown in FIG. 13A.

Figure 13B:
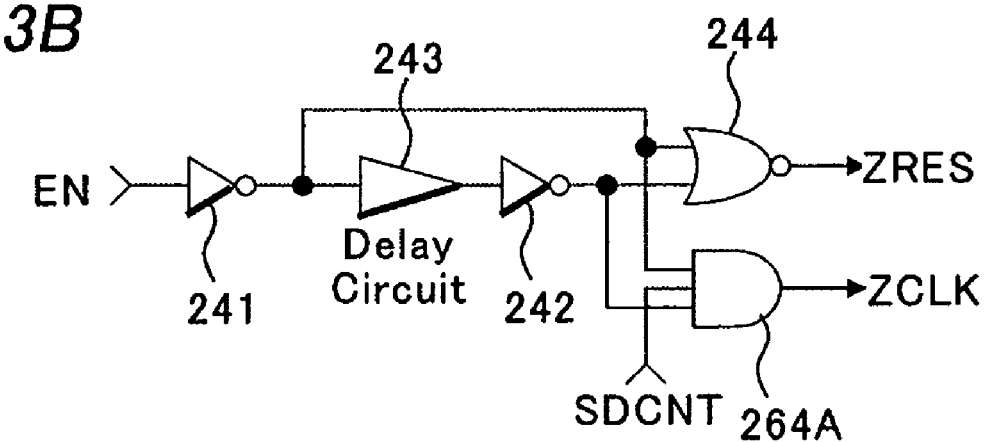

That is, the latch clock generation circuit 26A generates the latch clock ZCLK only when the enable signal EN falls to the L level and the count output signal SDCNT is generated (that is, when it becomes the H level). The reset signal generation circuit 24 is same as that in the first embodiment. However, when it is unified with the latch clock generation circuit 26A, its circuit structure becomes as shown in FIG. 13B. In the circuit shown in FIG. 13B, the NAND circuit 264 of FIG. 7 is modified into the three input NAND circuit 264A to which the count output signal SDCNT is inputted.

The serial data counter 40 is essentially a circuit to admit transfer of data from the serial data input register 28 to a next stage circuit only when the data has a specific number of bits in the case where the data from the microcomputer 30 is transferred to the LSI and temporarily stored in the serial data input register 28. Surer frequency adjustment is made possible by adding the serial data counter 40 in this embodiment, because the frequency adjustment data ZP1 and ZP2 from the first and second zapping circuits 21 and 22 is latched and retained only when the data transferred from the microcomputer 30 has the specific number of bits.

Figure 14:
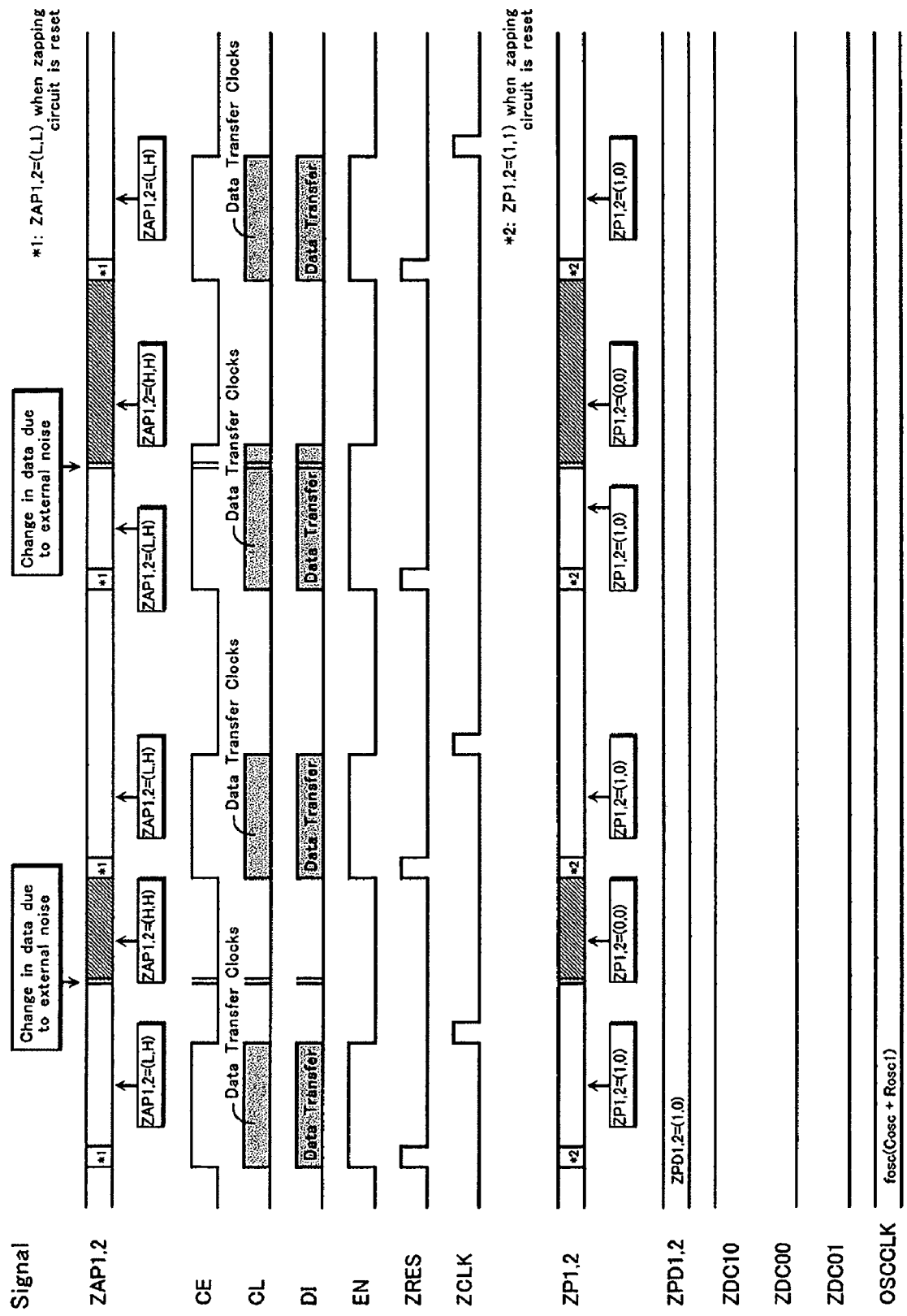
FIG. 14 is a timing chart showing operation of the frequency adjustment circuit according to the third embodiment of this invention.

Next, an operation of the frequency adjustment circuit described above will be explained hereinafter referring to a timing chart shown in FIG. 14. Only the operation specific to this embodiment due to the addition of the serial data counter 40 will be explained. Also, it is assumed that a result of oscillation frequency test on an oscillation circuit 10 by an LSI tester requires that the frequency adjustment data (ZP1, ZP2) is set to be (1, 0) in order to obtain the target oscillation frequency fosc. In this embodiment, the number of clocks counted by the serial data counter 40 is equal to the number of bits of the data, that is, one bit of data is serially transferred from the microcomputer 30 for every transfer clock.

As long as the interface circuit 27 receives the data transferred from the microcomputer properly, the count output signal SDCNT of the serial data counter 40 becomes the H level at every end of the data transfer, and the latch clock ZCLK is properly generated from the latch clock generation circuit 26A.

On the other hand, when an external noise enters while the interface circuit 27 is receiving the data transferred from the microcomputer 30 and a noise signal is caused on a communication line such as a chip enable line, a transfer clock line or a data line to make the number of the serial transfer clocks SCL abnormal, the count output signal SDCNT of the serial data counter 40 does not become the H level at the end of the data transfer and remains the L level.

As a result, the latch clock generation circuit 26A does not generate the latch clock ZCLK even when the enable signal EN falls to the L level. Therefore, even if the frequency adjustment data (ZP1, ZP2) is changed from (1, 0) to (0, 0), for example, the oscillation frequency fosc of the RC oscillation circuit 10 is kept constant since the wrong frequency adjustment data (0, 0) is not latched in the frequency adjustment data latch circuit 25.

Next, a frequency adjustment circuit according to a fourth embodiment of this invention will be explained. The frequency adjustment circuit in the fourth embodiment is the frequency adjustment circuit in the third embodiment with the interface circuit 27 replaced with that in the second embodiment shown in FIG. 10. That is, the interface circuit 27 has the CCB address register 273, the CCB address decoder 274, the chip enable detection circuit 275 and the address verify signal register 276, as described before. In addition, the serial data counter 40 that counts the serial transfer clocks SCL from the interface circuit 27 is provided.

Figure 15:
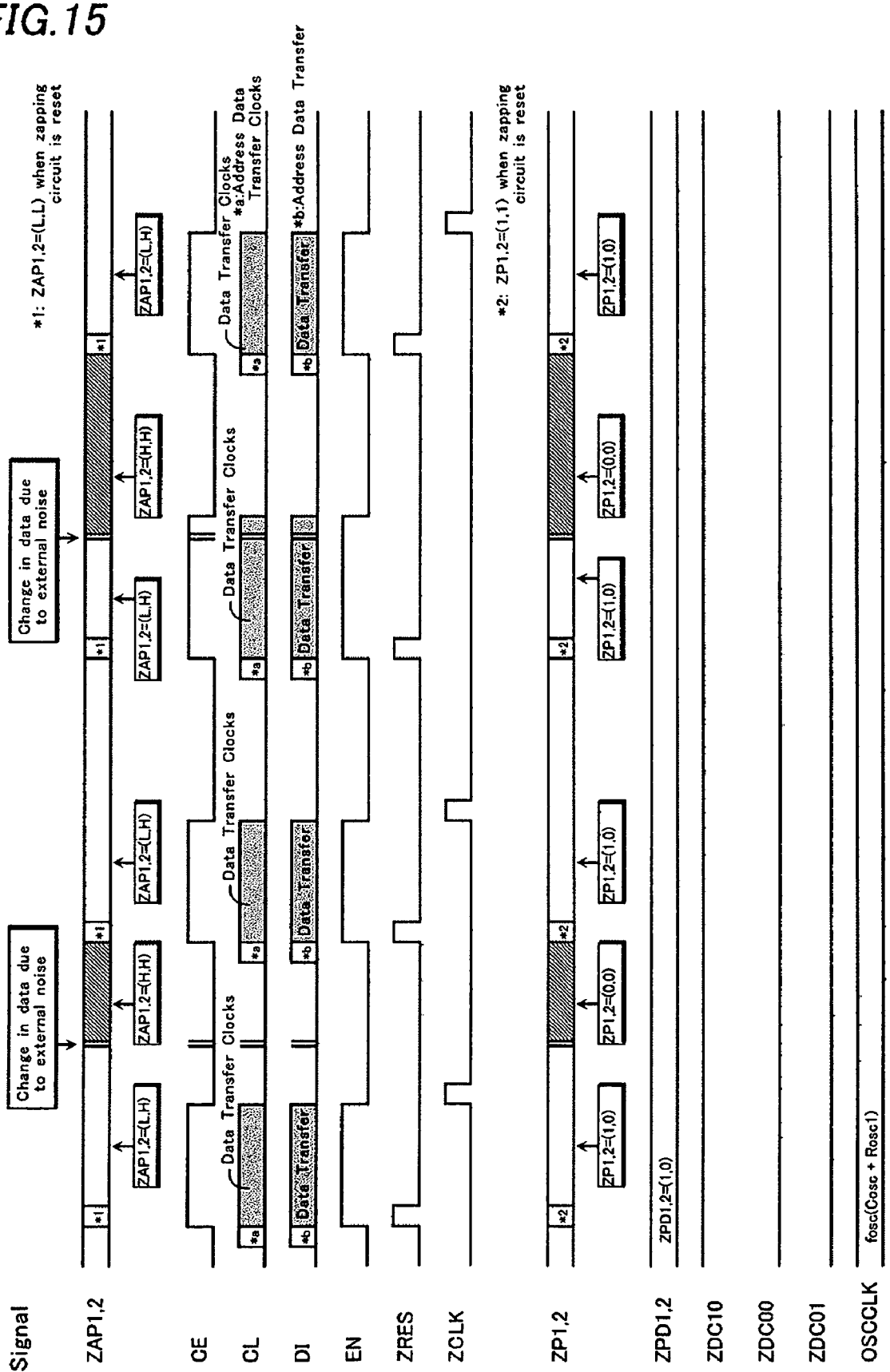
FIG. 15 is a timing chart showing operation of the frequency adjustment circuit according to a fourth embodiment of this invention.

An operation of the frequency adjustment circuit having a structure described above has features of operation of both the second embodiment and the third embodiment, as shown in a timing chart of FIG. 15. That is, the first and second zapping circuits 21 and 22 are reset when the address data transferred from the microcomputer 30 is verified by the interface circuit 27. And the frequency adjustment data ZP1 and ZP2 stored in the first and second zapping circuits 21 and 22 is latched in the frequency adjustment data latch circuit 25 only when the number of the serial transfer clocks SCL counted by the serial data counter 40 becomes the specific number while the data is transferred from the microcomputer 30. The oscillation frequency fosc of the RC oscillation circuit 10 is kept constant as described above.

Although two zapping circuits, that is, the first and second zapping circuits are provided in the first through fourth embodiments described above, the number of the zapping circuits may be increased for more precise frequency adjustment. In that case, the number of bits in the frequency adjustment data latch circuit 25 is increased and the structures of the frequency adjustment data decoder 23 and the time constant circuit 15 are also modified as appropriate, corresponding to the increase.

According to the embodiments of this invention, the target oscillation frequency can be maintained stable even when the frequency adjustment data is change by the external noise, since the frequency adjustment data of the zapping circuit is periodically refreshed to normal values and the frequency adjustment data latch circuit to latch and retain the refreshed frequency adjustment data is provided.

Another advantage for an LSI having an interface with a microcomputer is that the circuit structure can be made simple by obtaining the periodic reset signal and the latch clocks for the frequency adjustment data latch circuit utilizing the chip enable signal and the address data transferred from the microcomputer through the use of the existing interface.

In addition, the serial data counter that counts the number of bits of data transferred from the microcomputer is provided. The latch clock to the frequency adjustment data latch is controlled based on the output of the serial data counter so that the frequency adjustment data from the zapping circuit is latched and retained only when the data transferred from the microcomputer has the predetermined number of bits. Thus the target oscillation frequency can be maintained more securely even when the external noise enters into the circuit while the data is received from the microcomputer and the frequency adjustment data of the zapping circuit is changed, because the changed frequency adjustment data is not latched.

What is claimed is:

1. A frequency adjustment circuit that adjusts an oscillation frequency based on a time constant set by a time constant circuit, comprising:
   a zapping circuit that generates frequency adjustment data in response to a reset signal inputted periodically to the zapping circuit, the zapping circuit comprising a zapping device and the frequency adjustment data corresponding to a status of the zapping device;
   a frequency adjustment data latch circuit that retains the frequency adjustment data generated by the zapping circuit in response to a latch clock inputted periodically to the frequency adjustment data latch circuit, the latch clock being generated after a corresponding reset signal is generated; and
   a time constant adjustment circuit that receives the frequency adjustment data retained in the frequency data latch circuit and adjusts the time constant of the time constant circuit based on the frequency adjustment data.

2. The frequency adjustment circuit of claim 1, further comprising a reset signal generation circuit that generates the reset signal in accordance with a start of an enable signal and a latch clock generation circuit that generates the latch clock in accordance with an end of the enable signal.

3. The frequency adjustment circuit of claim 2, further comprising an interface circuit that receives data that is serially transferred from a computer, receives a transfer clock of the serially-transferred data and receives a chip enable signal so as to output the chip enable signal as the enable signal.

4. The frequency adjustment circuit of claim 2, further comprising an interface circuit that receives data that is serially transferred from a computer, receives address data that specifies an address of a device, receives a chip enable signal, receives transfer clocks of the serially-transferred data, the address data and the chip enable signal, and verifies that the received address data corresponds to a predetermined address so as to generate an address verify signal which is used as the enable signal.

5. The frequency adjustment circuit of claim 4, further comprising an address verify signal register that retains the address verify signal in response to the chip enable signal.

6. The frequency adjustment circuit of claim 5, wherein the address verify signal register takes in the address verify signal in accordance with a start of the chip enable signal and is reset in accordance with an end of the chip enable signal.

7. The frequency adjustment circuit of claim 1, wherein the zapping device comprises a fuse.

8. The frequency adjustment circuit of claim 1, wherein the time constant circuit comprises a resistor and a capacitor.

9. A frequency adjustment circuit that adjusts an oscillation frequency based on a time constant set by a time constant circuit, comprising:
- an interface circuit that receives a chip enable signal and data serially transferred from a computer, and receives transfer clocks of the chip enable signal and the serially-transferred data;
- a serial data counter that counts a number of bits of the serially-transferred data by counting the transfer clocks;
- a reset signal generation circuit that generates a reset signal in accordance with a start of the chip enable signal;
- a latch clock generation circuit that generates a latch clock in accordance with an end of the chip enable signal and a count output of the serial data counter;
- a zapping circuit that generates frequency adjustment data in response to the reset signal, the zapping circuit comprising a zapping device and the frequency adjustment data corresponding to a status of the zapping device;
- a frequency adjustment data latch circuit that retains the frequency adjustment data generated by the zapping circuit in response to the latch clock; and
- a time constant adjustment circuit that receives the frequency adjustment data retained in the frequency data latch circuit and adjusts the time constant of the time constant circuit based on the frequency adjustment data.

10. The frequency adjustment circuit of claim 9, wherein the zapping device comprises a fuse.

11. The frequency adjustment circuit of claim 9, wherein the time constant circuit comprises a resistor and a capacitor.

12. A frequency adjustment circuit that adjusts an oscillation frequency based on a time constant set by a time constant circuit, comprising:
- an interface circuit that receives data serially transferred from a computer, receives address data that specifies an address data of a device, receives a chip enable signal, receives transfer clocks of the serially-transferred data, the address data and the chip enable signal, and verifies that the address data corresponds to a predetermined address so as to generate an address verify signal;
- a serial data counter that counts a number of bits of the serially-transferred data by counting the transfer clocks;
- a reset signal generation circuit that generates a reset signal in accordance with a start of the address verify signal;
- a latch clock generation circuit that generates a latch clock in accordance with an end of the address verify signal and a count output of the serial data counter;
- a zapping circuit that generates frequency adjustment data in response to the reset signal, the zapping circuit comprising a zapping device and the frequency adjustment data corresponding to a status of the zapping device;
- a frequency adjustment data latch circuit that retains the frequency adjustment data generated by the zapping circuit in response to the latch clock; and
- a time constant adjustment circuit that receives the frequency adjustment data retained in the frequency data latch circuit and adjusts the time constant of the time constant circuit based on the frequency adjustment data.

13. The frequency adjustment circuit of claim 12, further comprising an address verify signal register that retains the address verify signal in response to the chip enable signal.

14. The frequency adjustment circuit of claim 12, wherein the address verify signal register takes in the address verify signal in accordance with a start of the chip enable signal and is reset in accordance with an end of the chip enable signal.

15. The frequency adjustment circuit of claim 12 wherein the zapping device comprises a fuse.

16. The frequency adjustment circuit of claim 12, wherein the time constant circuit comprises a resistor and a capacitor.

* * * * *